(12) United States Patent
Severson (10) Patent No.: US 7,098,715 B2
(45) Date of Patent: Aug. 29, 2006

(54) PROGRAMMABLE DUAL-EDGE TRIGGERED COUNTER

(75) Inventor: Matthew L. Severson, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 10/765,766

(22) Filed: Jan. 26, 2004

(65) Prior Publication Data

US 2004/0263221 A1  Dec. 30, 2004

Related U.S. Application Data

(60) Provisional application No. 60/444,336, filed on Jan. 30, 2003.

(51) Int. Cl.
*H03K 3/00* (2006.01)
(52) U.S. Cl. .................... 327/291; 327/298; 327/24; 327/36
(58) Field of Classification Search ............ 377/107, 377/118; 327/24, 26, 27, 36, 291, 298, 142, 327/151, 160
See application file for complete search history.

(56) References Cited

U.S. PATENT DOCUMENTS

| | | | | |
|---|---|---|---|---|
| 5,499,280 | A  * | 3/1996  | Wilson et al. | 377/108 |
| 6,172,538 | B1 * | 1/2001  | Selwan        | 327/141 |
| 6,404,840 | B1   | 6/2002  | Sindalovsky   | 377/48  |
| 6,449,329 | B1   | 9/2002  | Halter        | 377/114 |
| 6,489,817 | B1   | 12/2002 | Wong et al.   | 327/115 |
| 6,667,638 | B1 * | 12/2003 | Kramer et al. | 327/115 |
| 6,750,693 | B1 * | 6/2004  | Duewer        | 327/298 |

* cited by examiner

*Primary Examiner*—My-Trang Nu Ton
*Assistant Examiner*—An T. Luu
(74) *Attorney, Agent, or Firm*—Philip Wadsworth; Charles D. Brown; Donald C. Kordich (57) ABSTRACT

A counter for synthesizing clock signals with minimal jitter analyzes an ongoing count to determine whether the rising edge of an output clock should be triggered by the rising edge or falling edge of an input clock signal and to further determine whether the falling edge of the output clock should be triggered by the rising or the falling edge of the falling edge of the input clock signal. The counter may be implemented as a M/N:D counter in which a phase accumulator is compared to predetermined values to select the rising and falling edges of the output clock signal. In a default condition, the rising and falling edges of the output clock signal are triggered by rising edges of the input clock signal. However, if the accumulated phase value is greater than or equal to M/2 and less than M, an overriding signal will trigger the rising edge of the output clock based on the falling edge of the previous input clock cycle. If the accumulated phase value is greater than or equal to D+M/2 and less than M, the falling edge of the output clock is triggered by the falling edge of the preceding input clock signal. The use of rising and falling edges of the input clock signal reduces the jitter in the output clock signal and improves the duty cycle resolution. In addition, the clock circuit can produce a modulo-n signal with a 50% duty cycle. The designed architecture also produces an inverted output clock signal whose characteristics are identical to the non-inverted output clock signal (with the exception of duty cycle, which is inverted).

35 Claims, 6 Drawing Sheets

PROGRAMMABLE DUAL-EDGE TRIGGERED COUNTER

RELATED APPLICATIONS

This application claims priority to U.S. Provisional Application No. 60/444,336, filed Jan. 30, 2003.

BACKGROUND

1. Technical Field

The present invention relates to digital electronic circuits and, more specifically, to programmable counters.

2. Description of the Related Art

Counters are used in a variety of digital circuits to track events. In addition, counters are used to synthesize clock signals and other waveforms. Generally, a second (lower) clock frequency is synthesized from a first (higher) clock frequency using a counter. Typically, a simple M/N:D type counter is used, where M and N are integers and D is the duty cycle of the output clock.

The M/N:D counter is typically implemented as a rising edge counter that counts pulses from the first clock frequency and periodically outputs a pulse at the second clock frequency. That is, the M/N counter outputs M pulses for every N pulses of a reference or input clock. The conventional M/N:D counter is synchronized to the reference clock such that the rising edge of each of the M output pulses is derived from the rising edge of the reference clock.

This is relatively straightforward when the first clock frequency is an integer multiple of the second clock frequency. However, when the first clock is not an integer multiple of the second clock, the task of clock synthesis becomes a bit more challenging. For example, if the reference clock is a 5 megahertz (MHz) clock, and it is necessary to synthesize a 1.5 MHz clock, in accordance with conventional teachings, the M/N counter, programmed to M=3 and N=10, effectively multiplies the reference clock by a 3/10 or outputs three clock pulses for every ten clock pulses of the reference clock.

In this conventional circuit, the resolution of a counter is one full clock period. This error of 200 nanoseconds or one clock period in the example of the 5 MHz reference clock is known to those skilled in the art as jitter. Clock signals synthesized with conventional M/N:D counters suffer from excessive clock jitter because the conventional M/N:D counter generates an output clock edge from the same point (i.e., the rollover point), in the counter sequence. The rollover point is the point at which the counter terminates a preceding count and begins a new count. As a result, output clock jitter will vary from zero to the period of the input reference clock despite the fact the ideal output clock edge will always exist somewhere between the last clock edge of the counter period and the rollover clock edge.

Such jitter is unacceptable for certain high precision applications. One such application is the Universal Serial Bus (USB) application. In this application, jitter is unacceptable as it interferes with a clock recovery operation. Another illustrative application is the analog to digital conversion application. In this application, jitter is unacceptable because it results in unpredictable data conversion rates and excessive noise. For these and other applications, it is important that the M/N:D counter operate at high frequencies. However, as is well known in the art, an M/N:D counter's input clock frequency range directly correlates to the amount of jitter in the output clock.

Thus, there is a need in the art for an improved M/N counter with improved jitter performance. The present invention provides this and other advantages as will be apparent from the following detailed description and accompanying figures.

BRIEF SUMMARY

The present disclosure provides a system and method for generating output clock signals using a programmable clock circuit. In an exemplary embodiment, the programmable clock circuit generates frequencies from an input clock signal having a predetermined frequency and having a rising edge and falling edge associated with each clock cycle. The circuit comprises a counter configured to receive the input clock signal and to generate a counter signal having a frequency of M cycles for every N cycles of the input clock. A comparator couples to the counter compares a count value of the counter with predetermined count values and generates comparator signals related to the comparison. A control circuit generates an output clock signal based on a comparator signals to thereby select a rising edge of the output clock signal based on a rising edge or a falling edge of the input clock signal and to select a falling edge of the output clock signal based on a rising edge or a falling edge of the input clock signal.

In one embodiment, the control circuit generates an output clock signal with a rising edge of the output clock signal based on a rising edge of the input clock signal if the comparator indicates that the counter has a value greater than or equal to 0 and less than M/2. Conversely, the control circuit generates the output clock signal with a rising edge of the output clock signal based on a falling edge of the input clock signal if the comparator indicates that the counter has a value greater than or equal to M/2 and less than M.

In one embodiment, the counter is a M/N:D counter where N/D is the average duty cycle of the output clock signal. In one embodiment, the control circuit generates the output clock signal with a falling edge of the output clock signal based on a rising edge of the input clock signal if the comparator indicates that the counter has a value greater than or equal to D and less than D+M/2. Conversely, the control circuit generates the output clock signal with a falling edge of the output clock signal based on a falling edge of the input clock signal if the comparator indicates that the counter has a value greater than or equal to D+M/2 and less than D+M.

In one embodiment, the value of D may be selected with half integer resolution. This allows perfect division by half integers with a constant duty cycle for all values of N and a 50% duty cycle for even values of N. The counter circuit may also do Modulo-N division with no time jitter or frequency spurs to provide a 50% duty cycle in the output clock signal.

In an alternative embodiment, the programmable clock circuit comprises an input clock signal having a predetermined frequency and a control circuit to generate an output clock signal having a frequency of M cycles for every N cycles of the input clock and to select a rising edge of the output clock signal based on a rising edge or a falling edge of the input clock signal and to select a falling edge of the output clock signal based on a rising edge or a falling edge of the input clock signal. In one embodiment, the control circuit comprises a state machine that generates selected cycles of the output clock signal with a rising edge of the output clock signal based on a rising edge of the input clock and selected cycles of the output clock cycle with a rising edge of the output clock signal based on a falling edge of the input clock. The state machine may also generate selected cycles of the output clock signal with a falling edge of the output clock signal based on a rising edge of the input clock signal and selected cycles of the output clock signal with a falling edge of the output clock signal based on a falling edge of the input clock.

In yet another embodiment, the circuit may include a storage area containing data indicating which of the M cycles of the output clock signal have a rising edge based on a rising edge of the input clock and which of the M cycles of the output clock have a rising edge based on a falling edge of the input clock with the control circuit using the storage area data to generate the output clock signal. In another embodiment, the storage area may contain data indicating which of the M cycles of the output clock signal have a falling edge based on a rising edge of the input clock and which of the M cycles of the output clock signal have a falling edge based on a falling edge of the input clock with the control circuit using the storage area data to generate the output clock signal.

In yet another alternative embodiment, the circuit comprises a mode control input to override the control circuit where in the control circuit generates the output clock signal with a rising edge and a falling edge of the output clock signal based on a rising edge of the input clock signal irrespective of the counter value.

DETAILED DESCRIPTION

The advantages of the M/N:D counter are well known and include the ability to generate non-integer devisors of the input or reference clock. The waveform timing of a system synchronized only to the rising edge of the input clock will assist in a proper understanding of the invention described herein.

Figure 1:
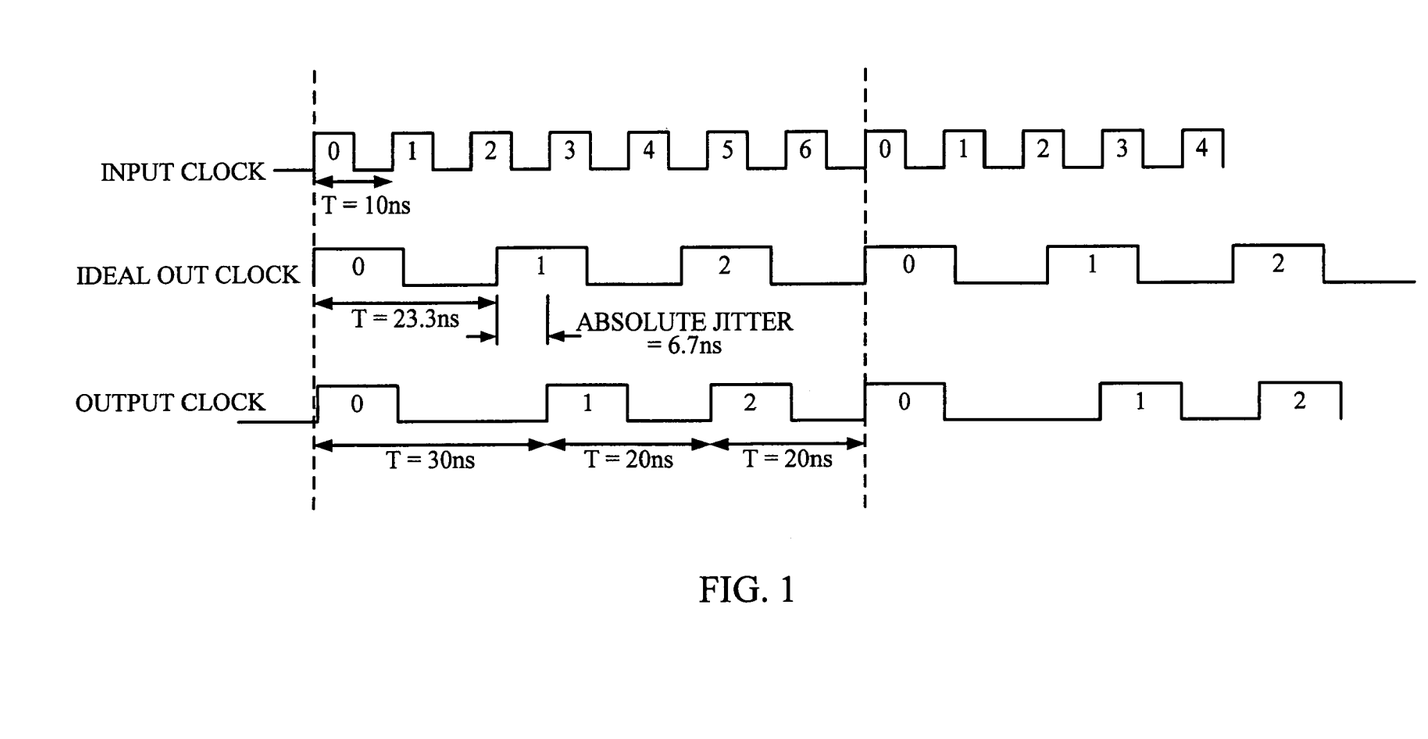
FIG. 1 illustrates a series of waveforms used by a conventional M/N counter that uses the rising edge of the input clock to trigger the rising and falling edges of the output clock.

FIG. 1 is a series of waveforms illustrating the use of only the rising edge of the input clock to trigger the rising edge of the output clock signal. In the example illustrated in FIG. 1, an input clock (top waveform) has a frequency of 100 megahertz (MHz). In the example illustrated in FIG. 1, M=3, N=7, and D=3. As is known in the art, the conventional M/N:D counter will produce three output clock pulses (i.e., M=3) for every 7 input clock pulses (i.e., N=7). For ease in understanding of the waveform relationships, the input clock cycles have been numbered 0–6 to correspond with the value N=7 while the output waveforms (the ideal output clock and the M/N output clock) have been labeled 0–2 to correspond to the value M=3.

The middle waveform in FIG. 1 illustrates the ideal output clock. It should be noted that the rising of the ideal output clock usually does not coincide with either the rising or the falling edge of the input clock.

The lower waveform in FIG. 1 illustrates the output of the M/N:D counter whose rising edge is always synchronized with the rising edge of the input clock. Synchronization to the rising edge only of the input clock results in significant jitter. The jitter for such a circuit configuration can equal one input clock period, which is 10 nanoseconds (ns) in the example illustrated in FIG. 1. Due to the selection of the programmable counter values (i.e., M=3 and N=7), the absolute jitter is 6.7 nanoseconds.

The present invention is directed to a circuit in which both the rising edge and the falling edge of the output clock may be synchronized to the rising edge or the falling edge of the reference clock. The synchronization of the rising edge of the output clock with the rising or falling edge of the reference clock is known in the art and described, by way of example, in U.S. Pat. No. 6,449,329.

The circuit described in the above-referenced patent implements a one-cycle delay between the input or reference clock and the output clock. During the one-cycle delay, a comparator analyzes the accumulated counts to determine whether the rising edge of the output clock should be triggered based on the rising edge of the reference clock for the rollover point or the falling edge of the preceding clock cycle of the reference clock.

In an exemplary embodiment, if the rollover value is less than M/2, then the rollover clock edge is closer to the ideal output clock edge. In this circumstance, the output clock is triggered based on the rising edge of the input clock. If the rollover value is greater than M/2, the falling clock edge preceding the rollover rising clock edge is the closer edge and the output clock is triggered based on the falling edge of the preceding input clock cycle.

In U.S. Pat. No. 6,449,329, a circuit is disclosed that permits the selection of the rising edge or the falling edge of the input clock to trigger the rising edge of the output clock. The advantages of such an arrangement are best understood with respect to an examination of FIG. 2. Again, the example utilizes a 100 MHz clock with the M/N:D counter having a value of M=3, N=7 and D=3. To assist in understanding of the invention, the input clock cycles have been numbered 0–6 to correspond with the value N=7 while the output waveforms (i.e., the ideal output clock and the M/N output clock) have been labeled 0–2 to correspond to the value M=3. The top waveform in FIG. 3 is a square wave of 100 MHz. The corresponding spectrum of the ideal clock input is shown to the right of the waveform and has a large peak centered at 100 MHz. Those skilled in the art will appreciate that odd-order harmonics are also present, but are not illustrated in the spectrum of FIG. 2, since the first odd-order harmonic occurs at 300 MHz.

Figure 2:
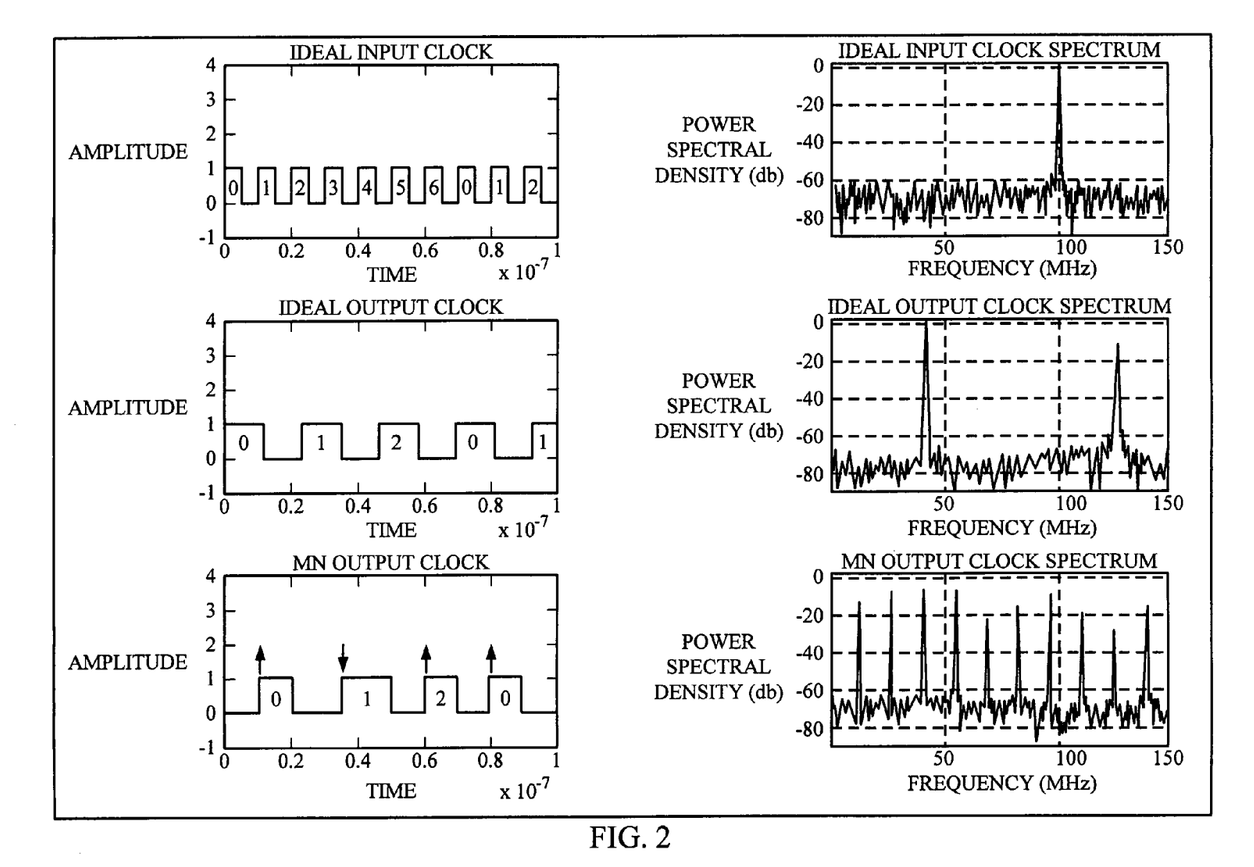
FIG. 2 illustrates a series of waveforms and associated spectra for a clock circuit that utilizes additional circuitry to select a rising or falling edge of the input clock to trigger the rising edge of the output clock.
Figure 3:
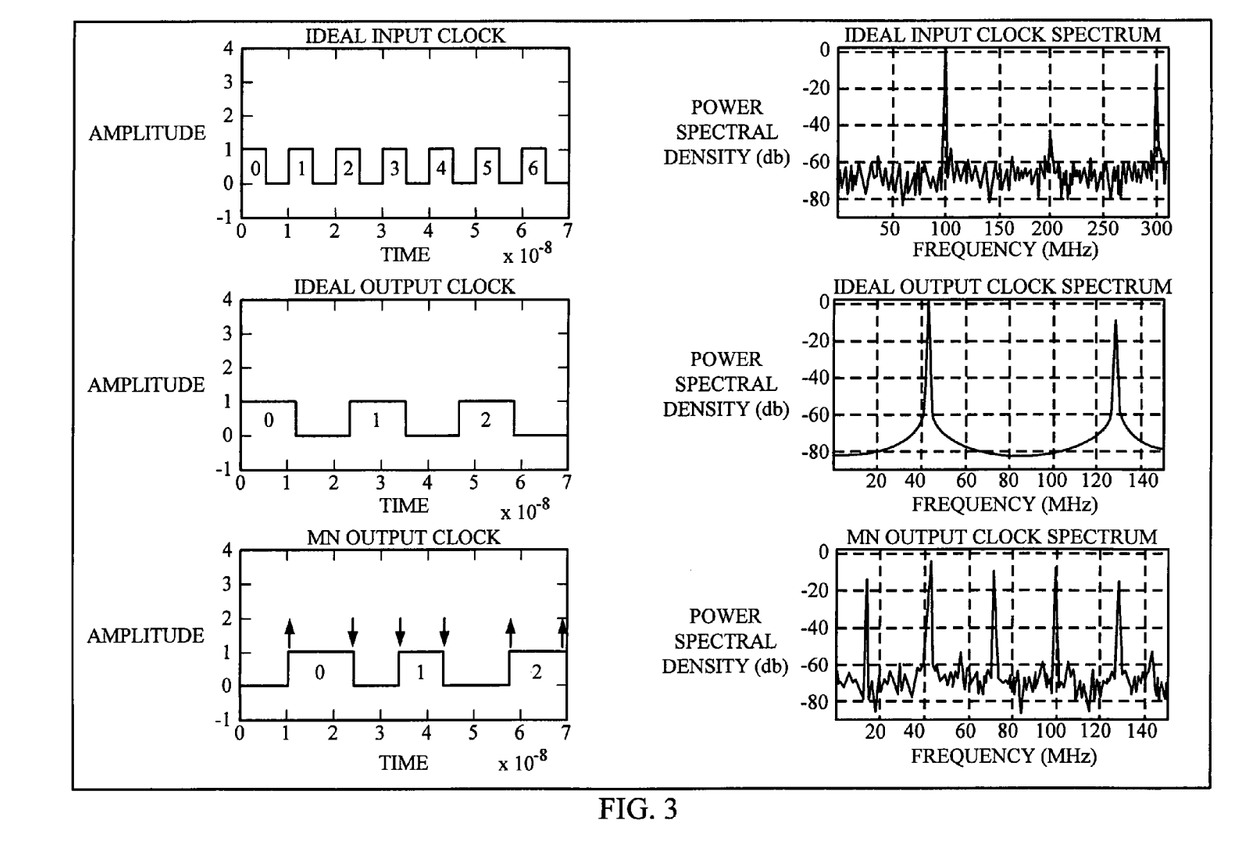
FIG. 3 illustrates a series of waveforms and associated spectra for a clock circuit that utilizes additional circuitry to select a rising or falling edge of the input clock to trigger both the rising and falling edge of the output clock.

The middle waveform in FIG. 2 is an ideal output clock whose rising and falling edges do not typically coincide with the rising or falling edge of the input clock. The spectrum of the ideal output clock is shown to the right of the waveform. The largest peak in the spectrum corresponds to the desired output signal at 42.8 MHz (i.e., 3/7×100 MHz). Note the output clock spectrum for the ideal output clock contains only the expected odd-order harmonics with only the first odd-order harmonic being shown at approximately 128.5 MHz.

The bottom waveform in FIG. 2 is the M/N:D output clock in which the rising edge of the output clock is selectively triggered from the rising edge or the falling edge of the input clock. As described above, the circuit uses a one-cycle delay in the generation of the first output clock pulse to permit the analysis of the output clock and allows the circuit to trigger off the next rising edge of the input clock or from the falling edge of the previous clock cycle.

In the bottom waveform of FIG. 2, upward pointing arrows are used to indicate output clock pulses that are triggered by the rising edge of the input clock while downward pointing arrows are used to indicate rising edge of output clock pulses that are triggered by the falling edge of the input clock. As can be seen in FIG. 2, the rising edge of the second clock pulse (i.e., the pulse labeled as 1 in FIG. 2) is triggered by the falling edge of pulse 3 of the input clock, rather than the rising edge of pulse 4. Such an approach to clock generation significantly decreases jitter from that known in the prior art.

This circuit architecture effectively reduces the jitter at the rising edge by a factor of two. That is, the maximum jitter at the rising edge is T/2, where T is the period of the input clock. Due to the nature of the M/N:D clock, output spurs in the clock power spectrum, shown to the right of the lower waveform in FIG. 2, occur at 1/N, 2/N, 3/N . . . M/N, . . . M/N, (N+1)/N, . . . . The largest spike is centered at the desired output frequency (i.e., M/N×input frequency). In the example illustrated in FIG. 2, the largest spike occurs at 3/7×100 MHz, which is at 42.8 MHz. As can be appreciated, the larger the value of N, the closer together the spurs will become in the output spectrum, assuming that the input or reference frequency is constant, and that M and N are relatively prime. The term "relatively prime" is a term known in the art to indicate that the two numbers (i.e., M and N) have no factors in common.

Although the clock circuit described in U.S. Pat. No. 6,449,329 produces the desired signal at M/N×input frequency, the proximity of spurs in the output clock spectrum may cause undesirable interference. It should be noted that the falling edge of each clock pulse in FIG. 2 is triggered on the rising edge of an input clock pulse.

The approach described herein analyzes both the rising and falling edges of the output clock to trigger the rising and falling edges of the output clock based on either the rising edge or the falling edge of the input clock. Because the rising and falling edges of the output clock are closer to their ideal position in time, circuit jitter is significantly reduced.

A definition of certain terms will provide a more complete understanding of the circuit performance improvements provided by selection of the rising or falling edge of the input clock signal for the rising and falling edges of the output clock signal. The term "absolute jitter" is defined as the difference between the location in time of the ideal clock edge and the actual clock edge as measured from some starting point. Depending on where this starting point is, the absolute jitter of the M/N:D counter is −T/2≦absolute jitter≦T/2, where T is the period of the input clock. The term "cycle to cycle jitter" is defined as the difference in time between two consecutive output clock cycles. In the example of FIG. 1, the cycle-to-cycle jitter is 10 ns. In the example of FIG. 2, the rise time cycle to cycle jitter is improved by 50%, but the cycle to cycle jitter as measured by the falling edge of output clock signal is still one cycle. In the output waveform of FIG. 3, the worst case cycle to cycle jitter measured from rising edge to rising edge or falling edge to falling edge of the output clock signal is T/2. The term "minimum period" is the smallest period of the output clock. This parameter is important because it represents the fastest frequency at which a circuit using the clock is required to run. In the example of FIG. 1, the minimum period is 20 ns. Those skilled in the art will recognize that the output of an M/N:D counter generates an output signal whose average frequency is the programmed frequency. In the examples illustrated in FIGS. 1–2, the output frequency is 3/7×100 MHz, which equals 42.8 megahertz. However, on a cycle to cycle bases, the circuit may have a minimum period of 20 nanoseconds. Thus, any digital circuit using this clock must operate correctly at 50 MHz to accommodate the maximum instantaneous frequency.

FIG. 3 illustrates waveforms and associated spectra for an ideal input clock, an ideal output clock, and a M/N:D counter designed in accordance with the present disclosure. Again, the examples illustrated in FIG. 3 utilize a 100 MHz input clock and have counter values of M=3, N=7, and D=3, and the individual pulses of the input clock and the output clocks have been labeled 0–6 and 0–2, respectively. The top waveform illustrates several cycles of an ideal input clock and to its right is the spectrum associated therewith. The middle waveform is an ideal clock output whose rising and falling edges typically do not coincide with the rising or falling edges of the input clock. The spectrum associated with the ideal output clock is shown to the right of the waveform.

The output of the M/N:D counter with selectable rising and falling edges is illustrated in the bottom waveform of FIG. 3. The upward arrows in the waveform illustrate leading or trailing output clock edges that are triggered by the rising edge of the input clock while downward arrows indicate rising or falling edges that are triggered by the falling edge of the input clock. As illustrated in FIG. 3, the rising edge of the clock pulse 0 is triggered by a rising edge of the input clock while the falling edge of that same output clock pulse (i.e., clock pulse 0) is triggered by a falling edge of the input clock. Both the rising and falling edges of output clock pulse 1 are triggered by falling edges of the input clock, while both the rising and falling edges of output clock pulse 2 are triggered by rising edges of the input clock.

Thus, it is apparent that both the rising and falling edges of the output clock are triggered by either rising or falling edges of the input clock in order to minimize cycle jitter on both the rise and fall of the output clock. This technique, which may be referred to as a balanced edge-triggered counter, has a maximum rise time cycle jitter of T/2 and a maximum fall time cycle jitter of T/2, where T is the period of the input clock. This reduces the fall time cycle jitter by a factor of 2 compared with either the single edge (i.e. synchronized only to rising edges of the input clock) or the dual edge (i.e. the rising edge of the output clock is synchronized either to the rising edge or the falling edge of the input clock) circuit designs.

Table 1 below compares characteristics of various clocking systems. Included in the comparison is the conventional single edge clock system in which the rising and falling edges of the output clock are based on the rising edge only of the input clock. Also shown in Table 1 are the characteristics of a dual edge system in which the rising edge of the output clock may be based either on the rising or falling edge of the input clock. Finally, Table 1 also illustrates the characteristics of a balanced dual edge circuit, such as the circuit 100 (see FIG. 5) in which both the rising edge and the falling edge of the output clock cycle may be based on the rising edge or the falling edge of the input clock.

TABLE 1

| Category | Single Edge | Dual Edge | Balanced Dual Edge |
|---|---|---|---|
| Cycle Jitter (rise) | T | T/2 | T/2 |
| Cycle Jitter (fall) | T | T | T/2 |
| Minimum Period (rise) | floor(N/M)1/$F_{ref}$ | floor(2N/M)1/2$F_{ref}$ | floor(2N/M)1/2$F_{ref}$ |
| Minimum Period (fall) | floor(N/M)1/$F_{ref}$ | floor(N/M)1/$F_{ref}$ | floor(2N/M)1/2$F_{ref}$ |
| Spur location | 2$F_{ref}$/N | $F_{ref}$/N | 2$F_{ref}$/N |
| Spur Height |  | −7 dB | −10 dB |
| Modulo-N | Yes | Yes | Yes |
| Modulo-N with 50% DC | No | No | Yes |
| Div N/2 with constant DC | No | No | Yes |
| Programmable DC | M ≦ D ≦ (N − M) | M ≦ D ≦ (N − M) | M ≦ D ≦ (N − M) |
| D resolution | 1 | 1 | 0.5 |
| Speed | >250 MHz | 250 MHz | 250 MHz |
| Size | 2 Adds | 2 Adds | 3 Adds |
|  | 4 Regs | 4 Regs | 5 Regs |
|  | 1 Comps | 3 Comps | 3 Comps |

In Table 1 above, the minimum period for the rise and fall of the output clock signal is related to the programmed values N and M as well as the frequency of the reference clock. The term "floor (N/M)" refers to the value of N/M rounded down to the nearest integer value. The balanced dual edge circuit described herein also has an improvement over the single edge and dual edge triggered counters in that it can generate a Modulo-N output signal with a 50% duty cycle. To achieve this, the program counter value M is set equal to 1 and D=N/2 for any N≧2. If some other duty cycle is desired, the programmable parameter D may be programmed such that it satisfies the following relationship: 1≦D≦(N−1).

The balanced dual edge triggered M/N:D counter has improved resolution on the programmable value D. The value D can now be chosen with 0.5 resolution and is programmed as the 1's complement of 2×D for hardware simplification, as will be discussed in greater detail below. Another major advantage is that the true output of the M/N:D counter and the inverted output have the same characteristics. That is, the jitter, minimum period and time sequence is the same for the output clock and its inverse. As those skilled in the art will appreciate, the duty cycle is reversed between the inverted and non-inverted outputs.

The balanced dual edge M/N:D counter can also perform perfect division by half integers. This is done by setting M=2 for any value N≧4. A 50% duty cycle can only be obtained for even values of N in this case, but a constant duty cycle is maintained for all N and D. Again, D can be chosen with 0.5 resolution to satisfy the value: 2≦D≦(N−2).

Furthermore, the M/N:D counter using a single edge or dual edge trigger is designed with a limitation on M that the value of M≦N/2. This limitation is improved by the balanced dual edge circuit. With the circuit of FIG. 5, described below, M can be set such that M≦2/3 (N).

Figure 4:
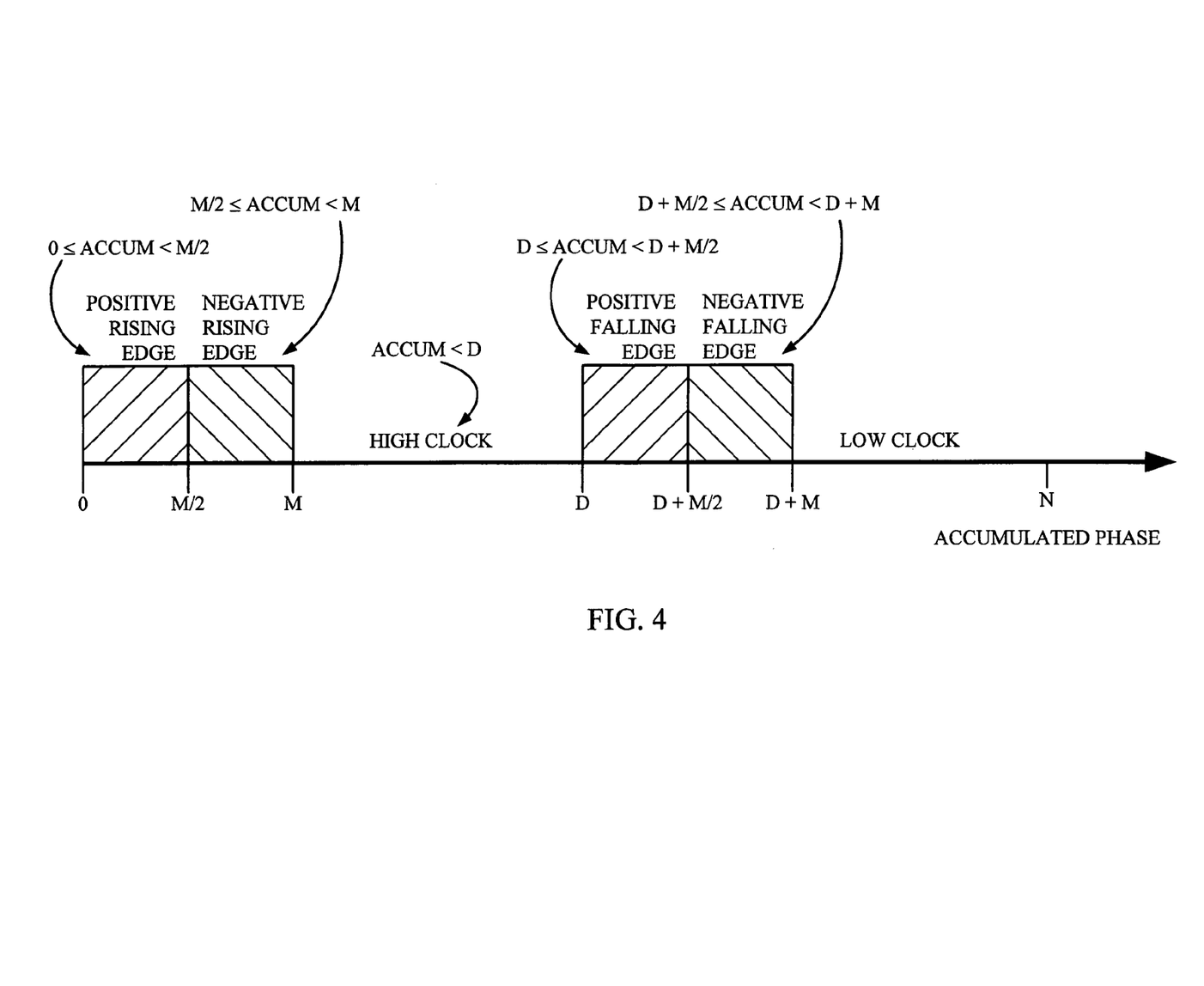
FIG. 4 illustrates the accumulated phase values used to determine the logic level of the output clock and the point of transition of the output clock.

There are a number of circuit implementations that may satisfactorily provide the desired output clock characteristics described in the lower waveform of FIG. 3. A counter and comparator circuit implementation may be used to determine the accumulated phase value and to compare it to predetermined count values. This concept is illustrated in the waveform of FIG. 4 where default condition is assumed to be that the output clock signal rising and falling edges are based on the rising edges of the input clock. That is, the rising edge of the output clock signal will be triggered by the rising edge of the input clock if the accumulated phase value (i.e., the count value) is greater than or equal to 0 and less than M/2. However, if the accumulated phase value is between M and M/2, the output clock signal rising edge should be triggered early by using the falling edge of the preceding input clock signal as the trigger for the rising edge of the output clock signal. If the count is exactly M/2, either rising or falling edge of the input clock can be used to trigger the rising edge of the output clock. However, it is desirable to maintain a balance between count values that trigger the output clock on the rising edge of the input signal and count values that trigger the output clock on the falling edge of the input signal. Thus the circuit 100 assigns the count value M/2 such that the negative edge of the input clock triggers the rising edge of the output clock signal if the count value is greater than or equal to M/2 and less than M. The output clock signal is high whenever the count value is less than D.

The default selection for the falling edge of the output clock signal is that it is triggered by the rising edge of the input clock. That is, the falling edge of the output clock signal will be triggered by the rising edge of the input clock signal if the accumulated phase value is greater than or equal to D and less than D+M/2. However, if the count value is between D+M/2 and D+M, the falling edge of the preceding input clock cycle is used to trigger the falling edge of the output clock signal. The circuit 100 assigns the count value of D+M/2 to the falling edge such that the falling edge of the output clock signal is triggered by the falling edge of the input clock if the count value is greater than or equal to D+M/2 and less than D+M. This maintains balance between count values that trigger the output clock signal on the rising edge of the input signal count values that trigger the output clock signal on the falling edge of the input signal.

Figure 5:
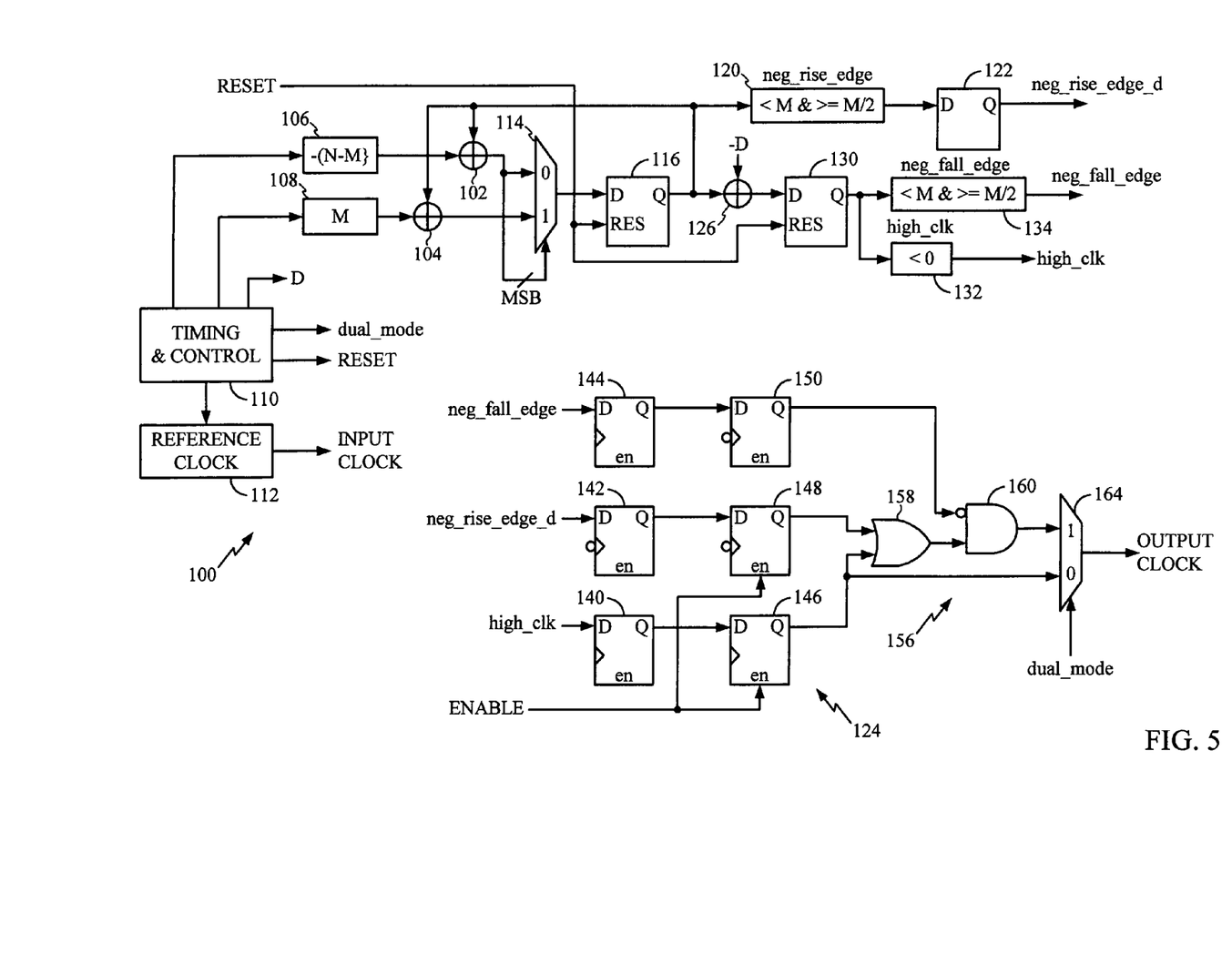
FIG. 5 is a block diagram illustrating an example implementation of a circuit used to generate the waveforms of FIG. 3.

FIG. 5 is a block diagram illustrating one embodiment of a circuit 100 capable of generating such clock signals. The circuit 100 is illustrated in a somewhat schematic form, but omits known circuit connections. Any omitted connections are well within the design abilities of one of ordinary skill in the art.

The circuit 100 includes first and second adders, 102 and 104, respectively. In an exemplary embodiment, the inputs to the first and second adders 102–104 are 17-bit programmable inputs and all programmable values are programmed as 2's complement values. However, those skilled in the art will recognize that the number of input bits may be selected to accommodate the desired operational range and different mathematical representations may be satisfactorily used in the circuit 100. The input value to the first adder 102 is provided by a register 106 while the input to the second adder 104 is provided by a register 108. The registers 106 and 108 may be hard coded or programmed by conventional means.

In an exemplary embodiment, a timing and control circuit 110 provides the input values to allow programming of the circuit 100, including the counter values M, N and D. The timing and control circuit 110 may generate not only the value M, but the quantities −(N−M), −D, and the like to simplify circuit design. The timing and control circuit 110 also generates a reset signal RESET to initialize and reset the various circuit components. The timing and control circuit 110 also controls the operation of a reference clock 112. The reference clock 112 generates the input clock to the counter. The input to the register 106 (whether hard coded or programmed via the timing and control circuit 110) is one's complement version of the difference between the program counter values N and M (i.e., the value −(N−M)). The value of the register 108 is programmed with the counter value M.

The outputs of the first and second adders 102–104 provide first and second inputs, respectively, to a multiplexer 114. In addition, the most significant bit (MSB) of the output of the first adder 102 provides a control in put for the multiplexer 114. When the MSB goes high, it signals the multiplexer 114 to select the output of the second adder 104 instead of the output of the first adder 102.

The output of the multiplexer 114 is connected to the D inputs of a flip-flop 116 which functions as a phase accumulator. The outputs of the flip-flop 116 are fed back to the adders 102 and 104, and further provided to the input of a comparator 120. The comparator 120 compares the output of the phase accumulator flip-flop 116 to determine whether the value is greater than or equal to the value M/2 and less than the value M. In such a situation, the rising edge of the output clock should be triggered by the negative or falling edge of the preceding input clock, as illustrated in FIG. 4. If these conditions are met, the output of the comparator 120 is fed to the input of a latch flip-flop 122 and provided to a retiming circuit 124.

The output of the phase accumulator flip-flop 116 is also coupled to a third adder 126. The value from the phase accumulator flip-flop 116 is added to the negative value of the program parameter D.

The output of the third adder 126 is coupled to a high speed latch 130 whose output is coupled to comparators 132 and 134.

The output clock remains at a high logic level so long as the value in the phase accumulator flip-flop 116 is less than the program parameter D. The adder 126, latch 130, and comparator 132, are used to make such a determination. Because the adder 126 was programmed with the negative value of D, the comparator 132 determines whether the output of the latch 130 is less than zero. If the output of the latch 130 is less than zero, the signal from the comparator 132 enables a HIGH_CLK signal line, which causes the output clock to be triggered only on the rising edges of the appropriate input clock signals.

The output of the latch 130 is also coupled to the comparator 134 to determine whether the falling edge of the output clock signal should be triggered on the falling edge of the input clock signal. As illustrated in FIG. 4, the falling edge of the clock signal is triggered off the negative falling edge of the preceding input clock signal if the value of the phase accumulator flip-flop 116 has a value greater than or equal to D+M/2 and less than the value D+M. If the value D is subtracted from that inequality, the output clock should be triggered on the falling edge of the input clock if the value of the accumulator flip-flop minus D is greater than or equal to the value M/2 and less than the value M. The adder 126 adds the value of −D (i.e., subtracts D) from the value of the phase accumulator flip-flop 116. Thus, the comparator 134 determines whether the output of the adder 126 has a value greater than or equal to M/2 and less than the value M. If these conditions are met, it is more accurate to have the falling edge of the output clock triggered by the falling edge of the preceding input clock signal. The output of the comparator 134 is coupled to the retiming circuit 124 in a manner described below.

The retiming circuit 124 functions as a control circuit to generate and synchronize the appropriate output clock signals based on the comparator signals to thereby select a rising edge of the output clock signal based on a rising edge or a falling edge of the input clock signal, and to select a falling edge of the output clock signal based on a rising edge or a falling edge of the input clock signal. The default mode of operation is to have the output clock rising and falling with the rising edge of the input clock signals. This is accomplished using the output of the comparator 132 coupled to the input of a latch 140 via the HIGH_CLK signal. If, based on the comparator results, the rising edge of the output clock signal should be triggered by the falling edge of the input clock (i.e., the value of the accumulator is greater than or equal to M/2, and ≦M), the output of the comparator 120 is set to a high level to generate a NEG_RISE_EDGE signal. That signal is delayed one clock cycle by the latch flip-flop 122. Thus, an input signal to a latch 142 illustrated in FIG. 5 is designated as NEG_RISE_EDGE_D to indicate that it is a delayed version of the NEG_RISE_EDGE signal generated by the comparator 120. In this instance, the output clock will be forced high one-half cycle earlier than the default condition.

The falling edge of the output clock signal should be triggered on the negative falling edge of the input signal if the output of the phase accumulator flip-flop 116 meets the criteria expressed above (i.e., the value is greater than or equal to D+M/2 and less than D+M). In that event, the output of the comparator 134 is valid and a signal NEG_FALL_EDGE is generated and coupled to the input of a latch 144. Activation of the latch 144 will cause the output clock to be forced low one-half cycle earlier than the default condition.

The outputs of the latches 140–144 are coupled to synchronization latches 146–150, respectively. The outputs of the synchronization latches 146–152 are coupled to a combinatorial logic circuit 156 comprising an OR gate 158 and an AND gate 160. The HIGH_CLK signal is delayed three clock cycles from the phase accumulator flip flop 116 to the output of the latch 146 by a total of three clock cycles. In order to accommodate a rising clock edge of the output clock based on the negative falling edge of the previous clock signal, the clocks of the latch 142 and the synchronization latch 148 are triggered by falling edges of the input clock such that the total delay from the phase accumulator flip flop 116 to the output of the synchronization latch 148 is 2½ input clock cycles. Thus, the activation of the NEG_RISE_EDGE signal will force the output clock high one-half cycle early as compared with the HIGH_CLK signal.

Similarly, the NEG_FALL_EDGE signal is synchronized by a falling edge of the input clock signal coupled to the synchronization latch 150 so as to force the output clock signal low one-half cycle early as compared with the HIGH_CLK signal.

When the output clock should be high, the output of the synchronization latch 150 is zero and the inverted value thereof is coupled to an input of the AND gate 160. In this situation, the logic value of the output clock is controlled by the output of the synchronization latches 146 and 148, which are provided as inputs to the OR gate 158. Under normal conditions, the output of the synchronization latch 148 is low. In that event, the default output from the synchronization latch 146 controls the rise and fall of the output clock via the combinatorial logic circuit 156. However, if the output clock should be forced high one-half cycle early, the output of the synchronization latch 148 goes high to force the output of the OR gate 158 high, one-half cycle early. Similarly, if the falling edge of the output clock should be based on the falling edge of the input clock (i.e., forced low one-half cycle early), the output of the synchronization latch 150 goes high, which forces the inverted input of the AND gate 160 low, and forces the output clock low one-half cycle early.

The output of the combinatorial circuit 156 could be used directly as the output clock. However, in some applications backward compatibility is desired, which requires the utilization of the conventional mode of triggering the output clock based on the rising edge only of the input clock. The timing and control circuit 110 generates a control input signal, DUAL_MODE to control the input of a multiplexer 164. If the circuit 100 is required to generate the output clock based solely on the rising edge of the input clock, the output of the synchronization latch 146 is selected as the output clock, via the multiplexer 164 thus triggering the output clock based solely on rising edges of the input clock. If the remaining portions of the circuit are enabled, the output of the synchronization latches 146–150 are combined in the manner described above and provided as an input to the multiplexer 164 to generate the output clock having a balanced dual edge operation.

The circuit 100 provides improved characteristics for cycle jitter on both the rising edge and falling edge. In addition, other characteristics are provided by the circuit 100 including the ability to generate inverted clock signals having the same characteristics as the non-inverted clock signal (with the exception of the duty cycle, which is reversed).

Figure 6:
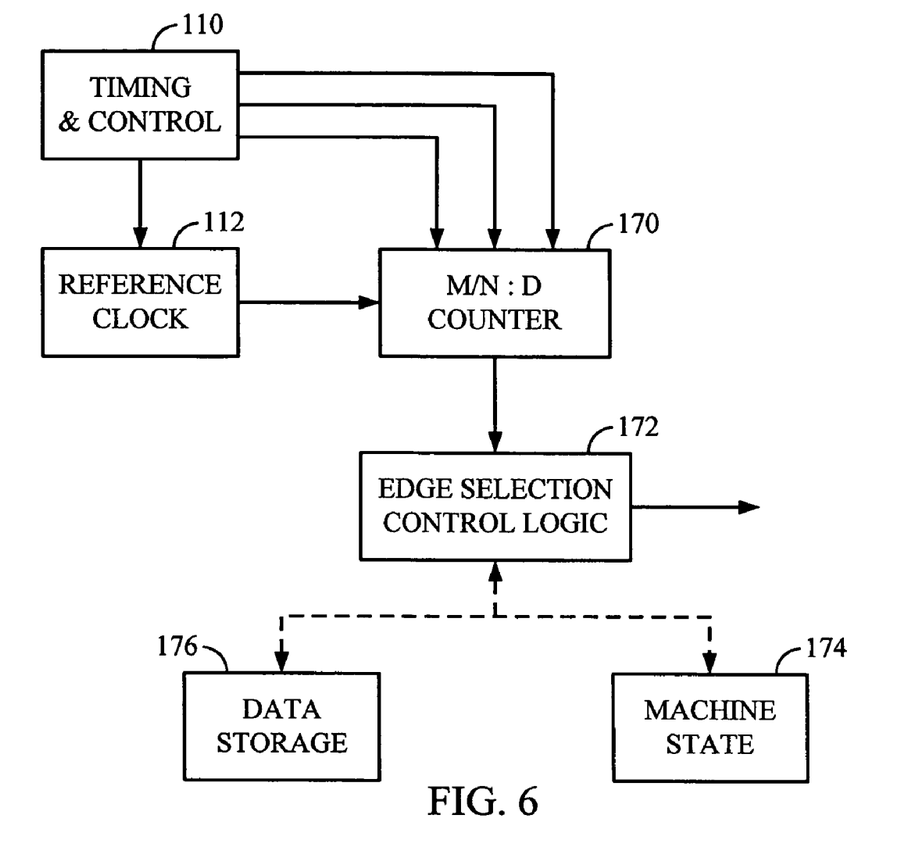
FIG. 6 is a block diagram illustrating an example of alternative implementation of a circuit used to generate the waveforms of FIG. 3.

The clock circuit described above with respect to FIG. 5 is capable of generating a wide range of frequencies from a single input or reference clock. This allows a single clock to generate multiple frequencies necessary for different applications. Some applications, such as wireless communication with different communication standards require a limited number of different frequencies. For example, CDMA wireless communication transmits data a chip rate of 1.2288 MHz, while an alternative communication standard, GSM, transmits at a chip rate of 1.023 MHz. In wireless applications such as this, broad programming range of the M/N counter is unnecessary since only a limited number of frequencies are required. In this case, an alternative embodiment for the counter, illustrated in the functional block diagram of FIG. 6, can be used to generate the necessary output waveform. In FIG. 6, an M/N:D counter 170 operates in a conventional manner to generate M output cycles for every N input cycles. Edge selection control logic 172 is coupled to the counter 170 and generates the output clock whose rising and falling edges are triggered by rising or falling edges of the input clock based on a state machine 174 or in a data storage area 176. It should be noted that, for a selected frequency of the output clock signal, the M output cycles are periodic. That is, certain of the M output cycles have a rising edge triggered on the rising edge of the input clock while other cycles of the M output cycles have a rising edge triggered on the falling edge of the input clock. Similarly, certain cycles of the M output cycles have the falling edge triggered on the rising edge of the input clock while others of the M output cycles have the falling edge triggered on the falling edge of the input clock. Using the example of the M/N output clock waveform (bottom waveform) of FIG. 3, it is noted that the rising edge of cycle 0 is triggered on the rising edge of the input clock while the falling edge of clock cycle 0 is triggered on a falling edge of the input clock. Both the rising and falling edges of clock cycle 1 are triggered on falling edges of the input clock while both the rising and falling edges of output clock cycle 2 are triggered by rising edges of the input clock. This pattern repeats for the M output cycles. In this example, the state machine 174 is programmed to provide the edge selection control logic 172 with the necessary signals such that the output clock signal is triggered off the appropriate rising or falling edges of the input clock. In a similar fashion, data stored within the data storage area 176 provides the edge selection control logic 172 with the necessary control signals to select the appropriate rising and falling edges of the input clock to trigger cycles of the output clock signal.

For many applications with a limited number of desired output frequencies, the circuit of FIG. 6, with the state machine 174 or the alternative data storage area 176 are sufficient to generate the necessary output signals. Those skilled in the art will appreciate that a large number of output frequencies would consume significant space in the data storage area 176 or require increased complexity in the state machine 174. The application of FIG. 6 is limited only by the size of the storage area 176 or the complexity of the state machine 174.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A programmable clock circuit to generate frequencies from an input clock signal having a predetermined frequency and having a rising edge and a falling edge associated with each clock cycle of the input clock signal, the circuit comprising:
   a counter configured to receive the input clock signal and to generate a counter signal having a frequency of M cycles for every N cycles of the input clock signal;
   a comparator circuit coupled to the counter to compare a count value of the counter with predetermined count values and to generate comparator signals related to the comparison; and
   a control circuit to generate an output clock signal based on the comparator signals to thereby select a rising edge of the output clock signal based on a rising edge or a falling edge of the input clock signal and to select a falling edge of the output clock signal based on a rising edge or a falling edge of the input clock signal;
   wherein the counter is a M/N:D counter where D is related to a duty cycle of the output clock signal;
   wherein the control circuit generates the output clock signal with a falling edge of the output clock signal based on a rising edge of the input clock signal if the comparator signals indicate that the counter has a value greater than or equal to D and less than D+M/2.

2. The circuit of claim 1 wherein the control circuit generates the output clock signal with a rising edge of the output clock signal based on a rising edge of the input clock signal if the comparator signals indicate that the counter has a value greater than or equal to zero and less than M/2.

3. The circuit of claim 1 wherein the control circuit generates the output clock signal with a rising edge of the output clock signal based on a falling edge of the input clock signal if the comparator signals indicate that the counter has a value greater than or equal to M/2 and less than M.

4. The circuit of claim 1 wherein the control circuit generates the output clock signal with 50% duty cycle.

5. The circuit of claim 1 wherein D is programmed with a ½ integer resolution.

6. The circuit of claim 1 wherein the control circuit comprises first and second synchronization latches wherein the first synchronization latch generates the output signal rising edge based on a rising edge of a selected input clock cycle if activated, the second synchronization latch generates a signal to generate the output signal rising edge based on a falling edge of an input clock cycle preceding the selected input clock cycle if activated.

7. The circuit of claim 1 wherein the control circuit comprises first and second synchronization latches wherein the first synchronization latch generates the output signal falling edge based on a rising edge of a selected input clock cycle if activated, the second synchronization latch generates a signal to generate the output signal falling edge based on a falling edge of an input clock cycle preceding the selected input clock cycle if activated.

8. The circuit of claim 1, wherein the control circuit is configured to generate selected cycles of the output clock signal with a rising edge based on a rising edge of the input clock signal, and selected cycles of the output clock signal with a rising edge of the output clock signal based on a falling edge of the input clock.

9. The circuit of claim 8, wherein the control circuit is configured to generate selected cycles of the output clock signal with a falling edge based on a rising edge of she input clock signal, and selected cycles of the output clock signal with a falling edge of the output clock signal based on a falling edge of she input clock.

10. A programmable clock circuit to generate frequencies from an input clock signal having a predetermined frequency and having a rising edge and a falling edge associated with each clock cycle of the input clock signal, the circuit comprising:
   a counter configured to receive the input clock signal and to generate a counter signal having a frequency of M cycles for every N cycles of the input clock signal;
   a comparator circuit coupled to the counter to compare a count value of the counter with predetermined count values and to generate comparator signals related to the comparison; and
   a control circuit to generate an output clock signal based on the comparator signals to thereby select a rising edge of the output clock signal based on a rising edge or a falling edge of the input clock signal and to select a falling edge of the output clock signal based on a rising edge or a falling edge of the input clock signal:
      wherein the counter is a M/N:D counter where D is related to a duty cycle of the output clock signal;
      wherein the control circuit generates the output clock signal with a falling edge of the output clock signal based on a falling edge of the input clock signal if the comparator signals indicate that the counter has a value greater than or equal to D+M/2 and less than D+M.

11. A programmable clock circuit to generate frequencies from an input clock signal having a predetermined frequency and having a using edge and a falling edge associated with each clock cycle of the input clock signal, the circuit comprising:

a counter configured to receive the input clock signal and to generate a counter signal having a frequency of M cycles for every N cycles of the input clock signal;
a comparator circuit coupled to the counter to compare a count value of the counter with predetermined count values and to generate comparator signals related to the comparison; and
a control circuit to generate an output clock signal based on the comparator signals to thereby select a rising edge of the output clock signal based on a rising edge or a falling edge of the input clock signal and to select a falling edge of the output clock signal based on a rising edge or a falling edge of the input clock signal;
wherein the comparator circuit comprises first, second and third comparators, the first comparator comparing the counter value with a value of M and M/2, the second comparator comparing the counter value with a value D, where D is a programmable value related to a duty cycle of the output signal, and the third comparator comparing the counter value with a value of D+M and D+M/2; and
an adder to add a value of minus D to the counter value wherein the second comparator compares the counter value minus D to 0 and the third comparator compares the counter value minus D with a value of M and M/2.

12. A programmable clock circuit to generate frequencies from an input clock signal having a predetermined frequency and having a rising edge and a falling edge associated with each clock cycle of the input clock signal, the circuit comprising:
a counter configured to receive the input clock signal and to generate a counter signal having a frequency of M cycles for every N cycles of the input clock signal;
a comparator circuit coupled to the counter to compare a count value of the counter with predetermined count values and to generate comparator signals related to the comparison;
a control circuit to generate an output clock signal based on the comparator signals to thereby select a rising edge of the output clock signal based on a rising edge or a falling edge of the input clock signal and to select a falling edge of the output clock signal based on a rising edge or a falling edge of the input clock signal; and
a mode control input to override the control circuit wherein the control circuit generates the output clock signal with a rising edge and a falling edge of the output clock signal based on a rising edge of the input clock signal irrespective of the comparator signals.

13. A programmable clock circuit comprising:
an input clock signal having a predetermined frequency and having a rising edge and a falling edge associated with each clock cycle of the input clock signal;
a control circuit to generate an output clock signal having a frequency of M cycles for every N cycles of the input clock signal and to select a rising edge of selected cycles of the output clock signal based on a rising edge of the input clock signal, and a rising edge of other selected cycles of the output clock signal based on a falling edge of the input clock signal and to select a falling edge of selected cycles of the output clock signal based on a rising edge of the input clock signal, and a falling edge of other selected cycles of the output clock signal based on a falling edge of the input clock signal; and
a storage area containing data indicating which of the M cycles of the output clock signal having a falling edge based on a rising edge of the input clock and which of the M cycles of the output clock signal having a falling edge based on a falling edge of the input clock, the control circuit using the storage area data to generate the output clock signal.

14. A programmable clock circuit comprising:
an input clock signal having a predetermined frequency and having a rising edge and a falling edge associated with each clock cycle of the input clock signal; and
a control circuit to generate an output clock signal having a frequency of M cycles for every N cycles of the input clock signal and to select a rising edge of selected cycles of the output clock signal based on a rising edge of the input clock signal, and a rising edge of other selected cycles of the output clock signal based on a falling edge of the input clock signal and to select a falling edge of selected cycles of the output clock signal based on a rising edge of the input clock signal, and a falling edge of other selected cycles of the output clock signal based on a falling edge of the input clock signal; and
a storage area containing data indicating which of the M cycles of the output clock signal having a rising edge based on a rising edge of the input clock and which of the M cycles of the output clock signal having a rising edge based on a falling edge of the input clock, the control circuit using the storage area data to generate the output clock signal.

15. The circuit of claim 14 wherein the control circuit is a state machine that generates selected cycles of the output clock signal with a rising edge of the output clock signal based on a rising edge of the input clock and selected cycles of the output clock signal with a rising edge of the output clock signal based on a falling edge of the input clock.

16. The circuit of claim 14 wherein the control circuit is a state machine that generates selected cycles of the output clock signal with a falling edge of the output clock signal based on a rising edge of the input clock and selected cycles of the output clock signal with a falling edge of the output clock signal based on a Calling edge of the input clock.

17. A programmable clock circuit comprising:
means for receiving an input clock signal having a predetermined frequency and having a rising edge and a falling edge associated with each clock cycle of the input clock signal; and
control means for generating an output clock signal having a frequency of M cycles for every N cycles of the input clock signal and for selecting a rising edge of selected cycles of the output clock signal based on a rising edge of the input clock signal, and a rising edge of other selected cycles of the output clock signal based on a falling edge of the input clock signal and for selecting a falling edge of selected cycles of the output clock signal based on a rising edge of the input clock signal, and a falling edge of other selected cycles of the output clock signal based on a falling edge of the input clock signal;
wherein the control means comprises counter means for generating a counter value based on the input clock signal and comparison means for comparing the counter value to predetermined count values and output control means for generating the output clock signal with the rising edge of the output clock signal based on a rising edge or a falling edge of the input clock signal and a falling edge of the output clock signal based on a rising edge or a falling edge of the input clock signal based on the comparing the comparison means;

wherein the counter means comprises a M/N:D counter where D is related to a duty cycle of the output clock signal:

wherein the control means generates the output clock signal with a falling edge of the output clock signal based on a rising edge of the input clock signal if the comparator means indicates that the counter value is greater than or equal to D and less than D+M/2.

18. The circuit of claim 17 wherein the control means generates the output clock signal with a rising edge of the output clock signal based on a rising edge of the input clock signal if the comparator means indicates that the counter value is greater than or equal to zero and less then M/2.

19. The circuit of claim 17 wherein the control means generates the output clock signal with a rising edge of the output clock signal based on a falling edge of the input clock signal if the comparator means indicates that the counter value is greater than or equal to M/2 and less than M.

20. The circuit of claim 17 wherein the control means comprises a state machine that generates selected cycles of the output clock signal with a rising edge of the output clock signal based on a rising edge of the input clock and selected cycles of the output clock signal with a rising edge of the output clock signal based on a falling edge of the input clock.

21. The circuit of claim 17 wherein the control means comprises a state machine that generates selected cycles of the output clock signal with a falling edge of the output clock signal based on a rising edge of the input clock and selected cycles of the output clock signal with a falling edge of the output clock signal based on a falling edge of the input clock.

22. A programmable clock circuit comprising:

means for receiving an input clock signal having a predetermined frequency and having a rising edge and a falling edge associated with each clock cycle of the input clock signal; and control means for generating an output clock signal having a frequency of M cycles for every N cycles of the input clock signal and for selecting a rising edge of selected cycles of the output clock signal based on a name edge of the input clock signal, and a rising edge of other selected cycles of the output clock signal based on a falling edge of the input clock signal and for selecting a falling edge of selected cycles of the output clock signal based on a rising edge of the input clock signal, and a falling edge of other selected cycles of die output clock signal based on a falling edge of the input clock signal;

wherein the control means comprises counter means for generating a counter value based on the input clock signal and comparison means for comparing the counter value to predetermined count values and output control means for generating the output clock signal with the rising edge of the output clock signal based on a rising edge or a falling edge of the input clock signal and a falling edge of the output clock signal based on a rising edge or a falling edge of the input clock signal based on the comparing by the comparison means;

wherein the counter means comprises a M/N:D counter where D is related to a duty cycle of the output clock signal;

wherein the control means generates the output clock signal with a falling edge of the output clock signal based on a falling edge of the input clock signal if the comparator means indicates that the counter value is greater than or equal to D+M/2 and less than D+M.

23. A programmable clock circuit comprising:

means for receiving an input clock signal having a predetermined frequency and having a rising edge and a falling edge associated with each clock cycle of the input clock control means for generating an output clock signal having a frequency of M cycles for every N cycles of the input clock signal and for selecting a rising edge of selected cycles of the output clock signal based on a rising edge of the input clock signal, and a rising edge of other selected cycles of the output clock signal based on a falling edge of the input clock signal and for selecting a falling edge of selected cycles of the output clock signal based on a rising edge of the input clock signal, and a falling edge of other selected cycles of the output clock signal based on a falling edge of the input clock signal; and storage means for storing data indicating which of the M cycles of the output clock signal having a rising edge based on a rising edge of the input clock and which of the M cycles of the output clock signal having a rising edge based on a falling edge of the input clock, the control means using the stored data to generate the output clock signal.

24. A programmable clock circuit comprising:

means for receiving an input clock signal having a predetermined frequency and having a rising edge and a falling edge associated with each clock cycle of the input clock signal;

control means for generating an output clock signal having a frequency of M cycles for every N cycles of the input clock signal and for selecting a rising edge of selected cycles of the output clock signal based on a rising edge of the input clock signal, and a rising edge of other selected cycles of the output clock signal based on a falling edge of the input clock signal and for selecting a falling edge of selected cycles of the output clock signal based on a rising edge of the input clock signal, and a falling edge of other selected cycles of the output clock signal based on a falling edge of the input clock signal; and storage means for storing data indicating which of the M cycles of the output clock signal having a falling edge based on a rising edge of the input clock and which of the M cycles of the output clock signal having a falling edge based on a falling edge of the input clock, the control means using the stored data to generate to output clock signal.

25. A programmable clock circuit comprising:

means for receiving an input clock signal having a predetermined frequency and having a rising edge and a falling edge associated with each clock cycle of the input clock signal;

control means for generating an output clock signal having a frequency of M cycles for every N cycles of the input clock signal and for selecting rising edge at selected cycles of the output clock signal based on a rising edge of the input clock signal, and a rising edge of other selected cycles of the output clock signal based on a falling edge of the input clock signal and for selecting a falling edge of select cycles of the output clock signal based on a rising edge of the input clock signal, and a falling edge of other selected cycles of the output clock signal based on a falling edge of the input clock signal; and mode control means for overriding the control means wherein the control means always generates the output clock signal with a rising edge and a falling edge of the output clock signal based on a rising edge of the input clock signal.

26. A method for generating programmable clock frequencies comprising:
receiving an input clock signal having a predetermined frequency and having a rising edge and a falling edge associated with each clock cycle of the input clock signal; and
generating an output clock signal having a frequency of M cycles for every N cycles of the input clock signal with a rising edge of selected cycles of the output clock signal based on a rising edge of the input clock signal, and a rising edge of other selected cycles of the output clock signal based on a falling edge of the input clock signal, and a falling edge of selected cycles of the output clock signal based on a rising edge of the input clock signal, and a falling edge of other selected cycles of the output clock signal based on a falling edge of the input clock signal;
wherein generating the output clock signal comprises:
generating a counter value based on the input clock signal;
comparing the counter value to predetermined count values; and
generating the output clock signal with the rising edge of the output clock signal based on a rising edge or a falling of the input clock signal and with a falling edge of the output clock signal based on a rising edge or a falling edge of the input clock signal based on the comparing;
wherein the counting uses a M/N:D counter where D is related to a duty cycle of the output clock signal;
wherein the output clock signal is generated with a falling edge of the output clock signal based on a rising edge of the input clock signal if the comparing indicates that the counter value is greater than or equal to D and less than D+M/2.

27. The method of claim 26 wherein the output clock signal is generated with a rising edge of the output clock signal based on a rising edge of the input clock signal if the comparing indicates that the counter value is greater than or equal to zero and less than M/2.

28. The method of claim 26 wherein the output clock signal is generated with a rising edge of the output clock signal based on a falling edge of the input clock signal if the comparing indicates that the counter value is greater than or equal to M/2 and less than M.

29. The method of claim 26 wherein generating the output clock signal comprises using a state machine that generates selected cycles of the output clock signal with a rising edge of the output clock signal based on a rising edge of the input clock and selected cycles of the output clock signal with a rising edge of the output clock signal based on a falling edge of the input clock.

30. The method of claim 26 wherein generating the output clock signal comprises using a state machine that generates selected cycles of the output clock signal with a falling edge of the output clock signal based on a rising edge of the input clock and selected cycles of the output clock signal with a falling edge of the output clock signal based on a falling edge of the input clock.

31. A method for generating programmable clock frequencies comprising:

receiving an input clock signal having a predetermined frequency and having a rising edge and a falling edge associated with each clock cycle of the input clock signal; and
generating an output clock signal having a frequency of M cycles for every N cycles of the input clock signal with a rising edge of selected cycle of the output clock signal based on a rising edge of the input clock signal, and a rising edge of other selected cycles of the output clock signal based on a falling edge of the input clock signal, and a falling edge of selected cycles of the output clock signal based on a rising edge of the input clock signal, and a falling edge of other selected cycles of the output clock signal based on a falling edge of the input clock signal;
wherein generating the output clock signal comprises:
generating a counter value based on the input clock signal;
comparing the counter value to predetermined count values; and
generating the output clock signal with the rising edge of the output clock signal based on a rising edge or a falling edge of the input clock signal and with a falling edge of the output clock signal based on a rising edge or a falling edge of the input clock signal based on the comparing;
wherein the counting uses a M/N:D counter where D is related to a duty cycle of the output clock signal;
wherein the output clock signal is generated with a falling edge of the output clock signal based on a falling edge of the input clock signal if the comparing indicates that the counter value is greater than or equal to D+M/2 and less than D+M.

32. A method for generating programmable clock frequencies comprising:
receiving an input clock signal having a predetermined frequency and having rising edge and a falling edge associated with each clock cycle of the input clock signal;
generating an output clock signal having a frequency of M cycles for every N cycles of the input clock signal with a rising edge of selected cycles of the output clock signal based on a rising edge of the input clock signal, and a rising edge of other selected cycles of the output clock signal based on a falling edge of the input clock signal, and a falling edge of selected cycles of the output clock signal based on a rising edge of the input clock signal, and a falling edge of other selected cycles of the output clock signal based on a falling edge of the input clock signal; and
storing data indicating which of the M cycles of the output clock signal having a rising edge based on a rising edge of the input clock and which of the M cycles of the output clock signal having a rising edge based on a falling edge of the input clock, the generating the output clock signal using the stored data to generate the output clock signal.

33. A method for generating programmable clock frequencies comprising:
receiving an input clock signal having a predetermined frequency and having a rising edge and a falling edge associated with each clock cycle of the input clock signal;
generating an output clock signal having a frequency of M cycles for every N cycles of the input clock signal with a rising edge of selected cycles of the output clock signal based on a rising edge of the input clock signal, and a rising edge of other selected cycles of the output clock signal based on a falling edge of the input clock signal, and a falling edge of selected cycles of the output clock signal based on a rising edge of the input clock signal, and a falling edge of other selected cycles of the output clock signal based on a falling edge of the input clock signal; and storing data indicating which of the M cycles of the output clock signal having a falling edge based on a rising edge of the input clock and which of the M cycles of the output clock signal having a falling edge based on a falling edge of the input clock, the generating the output clock signal using the stored data to generate the output clock signal.

34. A method for generating programmable clock frequencies comprising:

receiving an input clock signal having a predetermined frequency and having a rising edge and a falling edge associated with each clock cycle of the input clock signal;

generating an output clock signal having a frequency of M cycles for every N cycles of the input clock signal with a rising edges of selected cycles of the output clock signal based on a rising edge of the input clock signal, and a rising edge of other selected cycles of the output clock signal based on a falling edge of the input clock signal, and a falling edge of selected cycles of the output clock signal based on a rising edge of the input clock signal, and a falling edge of other selected cycles of the output clock signal based on a falling edge of the input clock signal; and generating a mode control signal to override the generating the output clock signal wherein generating the output clock signal always generates the output clock signal with a rising edge and a falling edge of the output clock signal based on a rising edge of the input clock signal.

35. A programmable clock circuit to generate frequencies from an input clock signal having a predetermined frequency and having a rising edge and a falling edge associated with each clock cycle of the input clock signal, the circuit comprising:

a counter configured to receive the input clock signal and to generate a counter signal having a frequency of M cycles for every N cycle of the input clock signal;

a comparator circuit coupled to the counter to compare a count value of the counter with predetermined count values and to generate comparator signals related to the comparison; and a control circuit to generate an output clock signal based on the comparator signals to thereby select a rising edge of the output clock signal based on a rising edge or a falling edge of the input clock signal and to select a falling edge of the output clock signal based on a rising edge or a falling edge of the input clock signal;

wherein the control circuit is configured to select a rising edge of same cycles of the output clock signal based on a rising edge of the input clock signal, and a rising edge of some other cycles of the output clock signal based on a falling edge of the input clock signal, and to select a falling edge of some cycles of the output clock signal based on a rising edge of the input clock signal, and a falling edge of some other cycles of the output clock signal based on a falling edge of the input clock signal.

* * * * *